United States Patent
Dias

(10) Patent No.: US 10,566,892 B1
(45) Date of Patent: Feb. 18, 2020

(54) POWER STAGE OVERDRIVE EXTENDER FOR AREA OPTIMIZATION AND OPERATION AT LOW SUPPLY VOLTAGE

(71) Applicant: Dialog Semiconductor (UK) Limited, London (GB)

(72) Inventor: Nuno Dias, Swindon (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/268,641

(22) Filed: Feb. 6, 2019

(51) Int. Cl.
| H02M 3/00 | (2006.01) |
| H02M 1/08 | (2006.01) |
| H03K 17/687 | (2006.01) |
| H02M 3/156 | (2006.01) |
| H02M 3/07 | (2006.01) |

(52) U.S. Cl.
CPC ............ H02M 1/08 (2013.01); H02M 3/07 (2013.01); H02M 3/156 (2013.01); H03K 17/687 (2013.01); *H02M 2003/071* (2013.01)

(58) Field of Classification Search
CPC .......... H02M 1/08; H02M 3/07; H02M 3/156; H02M 2003/071; H03K 17/687
See application file for complete search history.

(56) References Cited

U.S. PATENT DOCUMENTS

| 3,646,369 | A * | 2/1972 | Fujimoto | ............... | H03K 5/023 |
| | | | | | 326/88 |
| 4,081,695 | A | 3/1978 | Allen et al. | | |
| 5,532,630 | A | 7/1996 | Waggoner et al. | | |
| 5,576,635 | A | 11/1996 | Partovi et al. | | |
| 6,169,441 | B1 | 1/2001 | Tihanyi | | |
| 6,525,574 | B1 * | 2/2003 | Herrera | .................. | G11C 27/02 |
| | | | | | 327/589 |
| 6,538,491 | B1 | 3/2003 | Spanoche | | |
| 6,917,240 | B2 | 7/2005 | Trafton et al. | | |
| 7,453,291 | B2 * | 11/2008 | Song | ..................... | G11C 27/02 |
| | | | | | 327/91 |
| 8,008,975 | B1 | 8/2011 | Allen et al. | | |
| 9,500,459 | B1 | 11/2016 | Hoelscher | | |
| 2002/0014908 | A1 | 2/2002 | Lauterbach | | |
| 2002/0021150 | A1 | 2/2002 | Tuchiya et al. | | |

(Continued)

FOREIGN PATENT DOCUMENTS

| CN | 102739044 | 10/2012 |
| CN | 103441669 | 12/2013 |

(Continued)

*Primary Examiner* — Dinh T Le
(74) *Attorney, Agent, or Firm* — Saile Ackerman LLC; Stephen B. Ackerman

(57) ABSTRACT

It is an object of one or more embodiments of the present disclosure to provide a power stage overdrive circuit, at low supply voltages, that can be enabled/disabled on the fly. The power stage overdrive circuit increases the overdrive of a power switch to allow for simple power stage architecture with high voltage PMOS and NMOS devices. The power stage overdrive circuit comprises a driver, configured to drive the power switch having a control terminal, for example a gate terminal, and a boost circuit, further comprising a boost capacitor having a first terminal coupled to a power supply, for example a battery, and a second terminal coupled to the control terminal, configured to provide an overdrive voltage to the control terminal to turn the power switch on.

15 Claims, 6 Drawing Sheets

(56) References Cited

U.S. PATENT DOCUMENTS

| | | |
|---|---|---|
| 2004/0036458 A1 | 2/2004 | Johnson et al. |
| 2008/0203991 A1 | 8/2008 | Williams |
| 2011/0148494 A1 | 6/2011 | Voegele |
| 2012/0049957 A1 | 3/2012 | Chung |
| 2013/0093503 A1 | 4/2013 | Kok et al. |
| 2013/0241515 A1 | 9/2013 | Yamashiro et al. |
| 2014/0062570 A1 | 3/2014 | Yu |
| 2015/0326114 A1 | 11/2015 | Rolland |
| 2016/0142049 A1 | 5/2016 | Richardson et al. |
| 2017/0140725 A1 | 5/2017 | Saeki |
| 2017/0302151 A1 | 10/2017 | Snook et al. |
| 2018/0004238 A1 | 1/2018 | Shen et al. |

FOREIGN PATENT DOCUMENTS

| | | |
|---|---|---|
| CN | 203630657 | 6/2014 |
| JP | H02284516 | 11/1990 |
| JP | 2007019844 | 1/2007 |

\* cited by examiner

POWER STAGE OVERDRIVE EXTENDER FOR AREA OPTIMIZATION AND OPERATION AT LOW SUPPLY VOLTAGE

BACKGROUND

Field

The present disclosure relates generally to Buck and other switching converters operating from a battery, and more specifically to power stage operation at low battery voltage.

Background

Switching converters often operate from a battery. The battery voltage (Vbat) varies over time and the Buck switching converter must support the full battery operating range. With advances in system integration and battery chemistry, the switching converters are often required to support operation down to lower minimum Vbat (Vbatmin) and higher maximum Vbat (Vbatmax).

FIG. 1 shows power stage 100, in a switching converter operated directly from the Vbat drivers, in order to achieve the most efficient power and area utilization, avoiding the requirements of extra supply rails in the prior art. Operating with reduced Vbatmin means that the power stage overdrive decreases and the power switches On resistance (Ron) becomes significant. The requirement of supporting decreasing Vbatmin through subsequent design generations leads to significant design changes in power stage architecture and/or to process technology, in order to use power switches that are compatible with reduced supply headroom, while maintaining the requirement to operate at higher Vbatmax. These changes often translate to significant cost in terms of design effort, silicon area, efficiency and risk. In FIG. 1, power stage control 110 supplies drivers 115 and 120, which in turn provide gate voltages gP and gN to the PMOS and NMOS switches, respectively. The values of gP and gN are between supply voltage Vss and battery voltage Vbat.

Power stage operation at low Vbat can be achieved by (1) cascading low voltage power switches, as in prior art FIG. 2, or by using (2) bootstrapping, as in prior art FIG. 3. Both solutions require significant silicon area and gate driving complexity due to having more domains and/or devices to be driven.

FIG. 2 illustrates cascade devices 200, and the need to have well-defined gate voltages gP and gN that track Vbat to protect the drain to source voltage of the power switches. For efficient power conversion, the Ron of the PMOS and NMOS cascode devices and PMOS and NMOS switch devices must be low, and therefore the device size is significant due to the series connection. The gate voltages of the cascade devices must be sufficiently low impedance to maintain regulation due to kickback from the switching node, which means silicon area and complexity for the cascode voltage generators Vcp and Vcn. The gate voltages of the power switches must be lower than Vbat, and generated somewhere in the system. The value of gate voltage gP is between Vbat-VgsP and Vbat, and gate voltage gN is between VgsN and Vss. Gate to source voltage VgsP applies to the PMOS switch, and gate to source voltage VgsN applies to the NMOS switch.

FIG. 3 shows bootstrapped system 300, and an extra boosted supply rail 315 generated by switching node VLX, to achieve the overdrive needed for the High Side switch, usually an NMOS. The bootstrapping not only adds circuit complexity, but also often requires extra pins and external components (i.e. the bootstrap capacitor Cboost). Alternatively the bill of material (BOM) can be reduced at the expense of silicon area, where the bootstrap capacitor is integrated. The bootstrap capacitor shares its charge with the High Side NMOS gate. Therefore, in order to achieve low Ron (i.e. high overdrive), the bootstrap must be comparable to gate gNH capacitance, which can be several hundreds of picofarads. Integrated capacitors usually have around 1.5 fF/um$^2$, which means for each 100 pF of integrated bootstrap capacitance, the area needed is 67000 um$^2$, which may lead to significant overhead. In FIG. 3, power stage control 310 supplies inputs to driver 315 and driver 320, which then provide gate voltages to the High Side and Low Side switches, respectively.

SUMMARY

Accordingly, it is an object of one or more embodiments of the present disclosure to provide a power stage overdrive circuit, at low supply voltages, that can be enabled/disabled on the fly.

It is a further object of one or more embodiments of the disclosure to increase the overdrive of the power switches of the switching converter to allow for simple power stage architecture with high voltage PMOS and NMOS devices.

Still further, it is an object of one or more embodiments of the disclosure to provide low implementation area overhead compared to existing architectures, resulting in the boost capacitor being approximately 10× smaller than the prior art.

Still further, it is an object of one or more embodiments of the disclosure to maintain switching performance and power conversion efficiency in the switching converter.

Still further, it is an object of one or more embodiments of the disclosure to maintain robust operation at high switching frequencies and high power switch on times.

Other objects will appear hereinafter.

The above and other objects of the present disclosure may be accomplished in the following manner. A power stage overdrive circuit is disclosed, comprising a driver, configured to drive a power switch having a control terminal, for example a gate terminal, and a boost circuit, further comprising a boost capacitor having a first terminal coupled to a power supply, for example a battery, and a second terminal coupled to the control terminal, configured to provide an overdrive voltage to the control terminal to turn the power switch on.

The above and other objects of the present disclosure may be further accomplished with a method for overdriving a circuit element. The steps include providing a driver. The steps also include driving a power switch having a control terminal. The steps also include providing a boost capacitor coupled to a power supply and the control terminal. The steps also include overdriving the control terminal, using the boost capacitor, to turn the power switch on.

In various embodiments the function may be achieved with a PMOS switch or an NMOS switch.

In various embodiments the function may be achieved for switched circuits requiring boosted gate drive voltages, such as power-converters, or signal conditioning circuits, such as switched-capacitor sampling circuits or choppers.

BRIEF DESCRIPTION OF THE DRAWINGS

The present disclosure will be more clearly understood from the following description taken in conjunction with the accompanying drawings in which like reference numerals designate similar or corresponding elements, regions and portions and in which.

DETAILED DESCRIPTION

The present disclosure provides a power stage overdrive extender circuit, for area optimization and operation at low supply voltage, in a switching converter operating from a battery. The overdrive of the power switches is increased to allow for a simple power stage architecture with high voltage PMOS and NMOS devices. Low implementation area overhead is achieved compared to existing architectures, resulting in the boost capacitor approximately 10× smaller than the prior art. Switching performance and power conversion efficiency is maintained.

The overdrive extender circuit provides gate to source voltage Vgs for the PMOS switch overdrive (i.e. Vgs>Vbat) without needing to provide the entire gate charge from the boost capacitor, allowing for a smaller capacitor and enabling lower Vbat circuit operation. The gate driver now provides gate charge Cgg sufficient to drive Vgs=Vbat for the power switch. The boost capacitor adds additional gate charge to achieve Vgs>Vbat, allowing the switch to remain in triode operation for lower system Vbat voltages. Faster clocks are not required, since only a modest timing change to a standard PWM gate-drive timing circuit is used to split the signal into charge and boost phases.

When operating at low minimum battery voltage (Vbatmin), the overdrive of prior art power switches is reduced, increasing the power switches On resistance (Ron). At critically low Vbatmin and high currents the power switches saturate, ceasing to work as switches, not allowing the switching converter to regulate anymore, as seen in FIG. 4.

Figure 1:
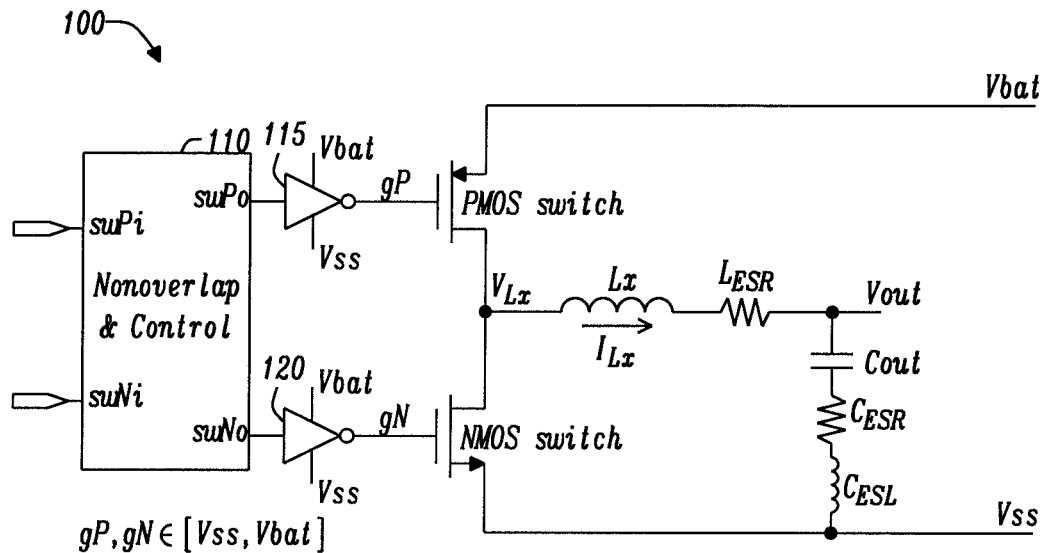
FIG. 1 illustrates a power stage of a switching converter operated directly from the battery voltage, avoiding the requirements of extra supply rails, in the prior art.
Figure 2:
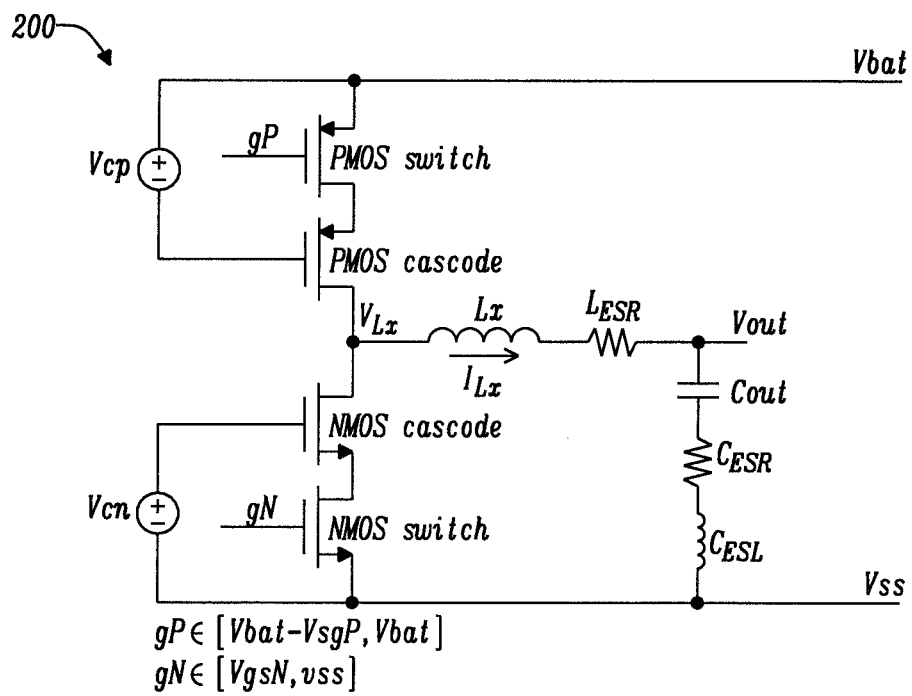
FIG. 2 shows how power stage operation at low battery voltage can be achieved by cascading low voltage power switches with sufficiently low impedance, in the prior art.
Figure 3:
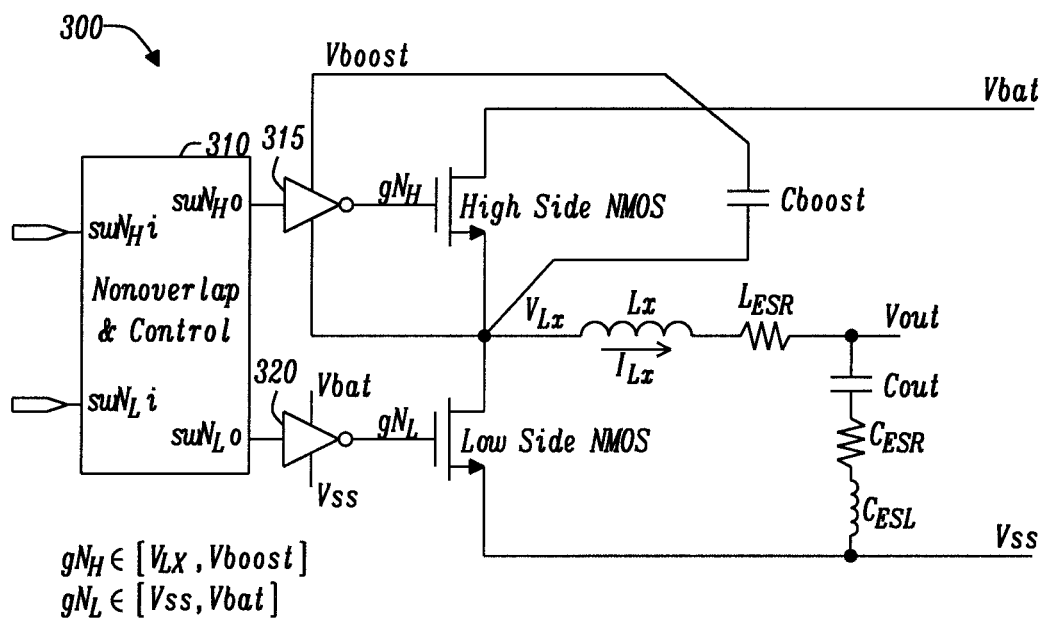
FIG. 3 illustrates how an extra boosted supply rail generated by the switching node can achieve power stage operation at low battery voltage, in the prior art.
Figure 4:
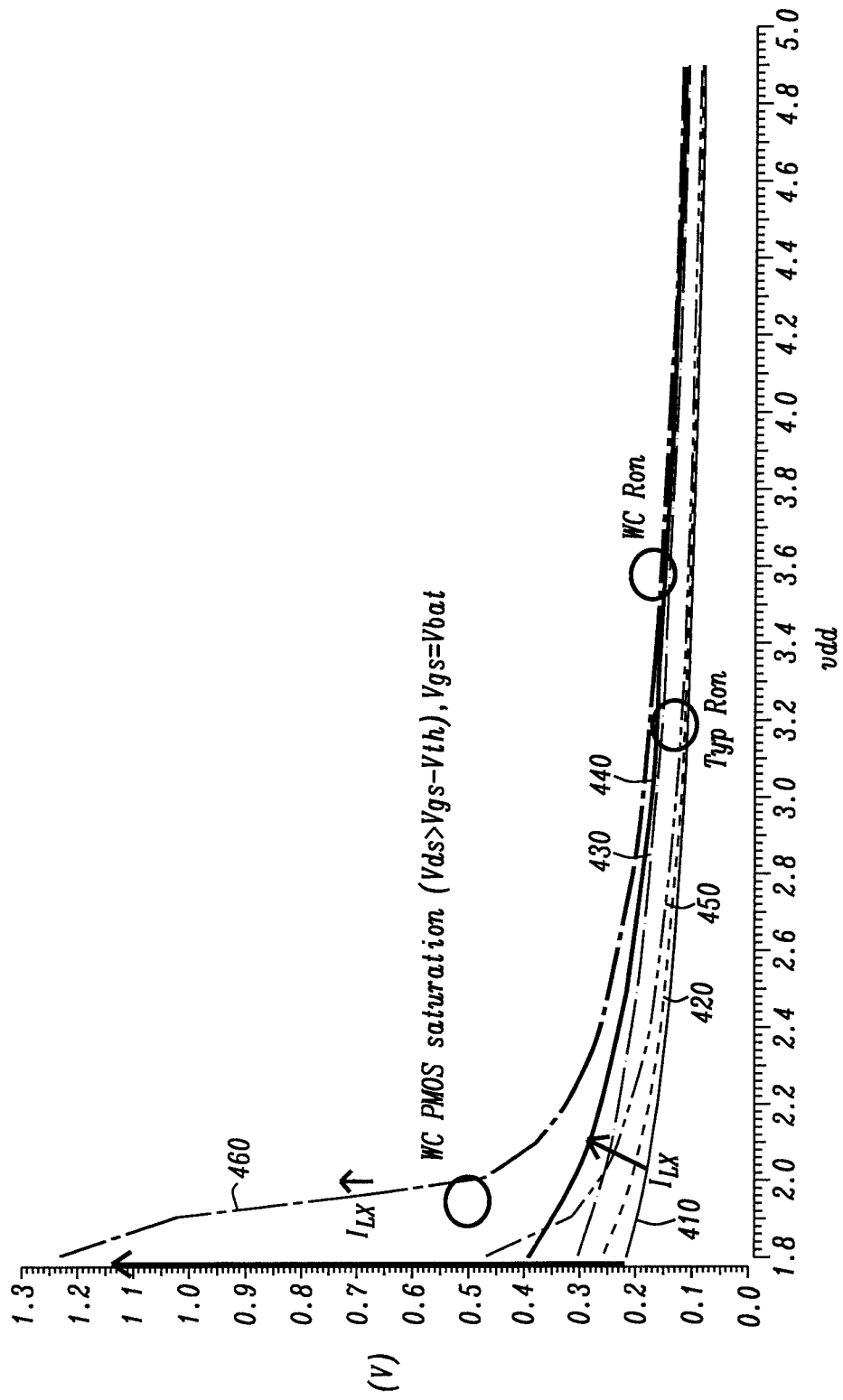
FIG. 4 shows the PMOS device On resistance compared to supply voltage at high load dependence, in the prior art.

FIG. 4. shows 400, where the PMOS device On resistance is compared to supply voltage Vdd=Vbat, at high load dependence, in the prior art. Typical process, voltage, and temperature (PVT) conditions are shown in Typ Ron, and worst case PVT conditions are shown in WC Ron. Worst case PMOS saturation (Vds>Vgs~Vth), and Vgs=Vbat, for low values of Vdd, is also shown, Vds is the drain to source voltage and Vth the threshold voltage for the PMOS switch. Note the high currents as the PMOS switch saturates at low voltages, where signals 410-460 indicate different PMOS On resistance for the PVT conditions.

The present disclosure is composed of two overdrive extending mechanisms, (1) a one-cycle overdrive boost, and (2) a negative charge pump for long on time overdrive regulation. These mechanisms have different functions.

While (1) is used at every power switch turn on in a low Vbat condition and it is compatible with high-frequency operation, (2) is only used in case the power switch is kept turned on for long periods of time (usually several micro seconds). The usage of (1) and (2) can be related or unrelated, i.e. the system at any point can operate with (1) only or with (1)+(2) or with (2) only. The mechanisms implemented by the disclosure are used only when the turn on swing of the power switch gate is detected or estimated.

Figure 5:
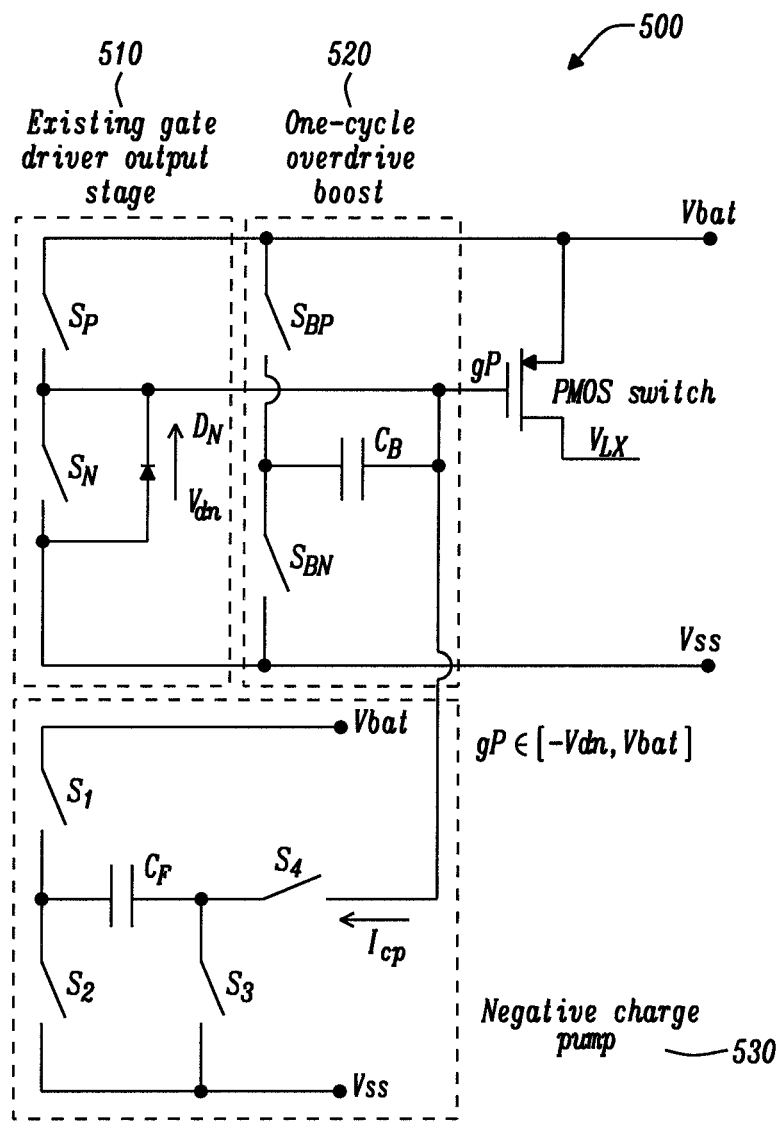
FIG. 5 illustrates a simplified diagram of the circuit of the present disclosure, realized for a PMOS switch.

FIG. 5 illustrates 500, a simplified diagram of the circuit of the present disclosure, realized for a PMOS switch. The principles of the disclosure may also be applied to an NMOS switch. At PMOS turn on, existing gate driver output stage 510 (composed of switches $S_P$ and $S_N$) swings gate voltage gP of the PMOS switch to Vss. When gP reaches the maximum excursion possible through the driver, $S_N$ opens setting gP to a high impedance state (hiZ). After gP is hiZ, switch $S_{BP}$ opens and switch $S_{BN}$ closes, in one-cycle overdrive boost 520. This removes further charge from gP via capacitor $C_B$, effectively increasing the PMOS switch overdrive. Depending on system requirements, and how $S_N$ is designed (isolated or non-isolated NMOS), gP will be able to swing to as low as $-Vdd*C_B/(C_B+Cgg)$, where Vdd is the supply voltage and Cgg is the equivalent PMOS gate capacitance, or gP will be clamped down to voltage $-Vdn$, respectively, where Vdn is the voltage developed across the diode at turn on. Vdn is a technology dependent parameter and is usually around 0.7V to 1.0V.

The one-cycle boost control resets $C_B$ in line with the PMOS turn off, via the gate driver. Since the gate driver already achieves a gP swing equivalent to Vbat, the one-cycle boost only needs to gain a few hundred mV (up to 400 mV typically, depending on the conditions). This means $C_B$ is a fraction of Cgg ($1/10^{th}$ typically), and also that $S_{BP}$ and $S_{BN}$ are a fraction of $S_P$ and $S_N$ in size, respectively.

For the typical application, the additional overdrive allowed by Vdn is enough to ensure triode operation of the PMOS switch. In fact Vdn provides a mechanism to limit the negative excursion of gP. The overdrive boost circuit creates the equivalent effect on the power switch so Vbatmin is effectively increased by Vdn, which is significant. Further increase is possible by isolating diode $D_N$ from switch $S_N$ and increasing $C_B/(C_B+Cgg)$.

Figure 6:
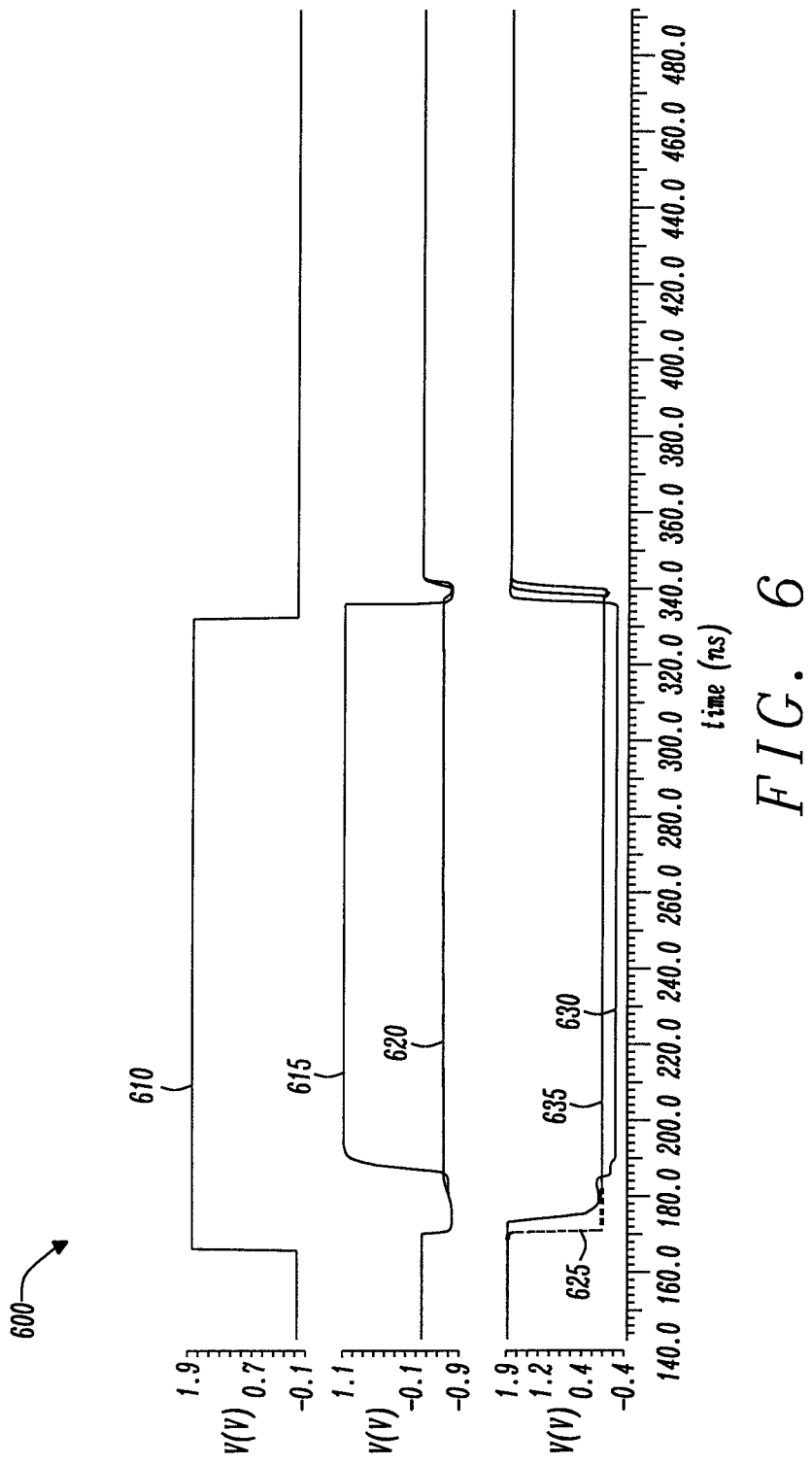
FIG. 6 shows simulation results of the proposed one-cycle overdrive boost circuit, and the difference at worst case conditions for the PMOS switch.

FIG. 6 presents simulation results 600, of proposed one-cycle overdrive boost 520, and the difference at worst case conditions for the PMOS switch. Worst case PMOS On resistance at Vbatmin is shown for the overdrive boost on, and the overdrive boost off. With the overdrive extender turned on, the Buck switching converter can switch, and VLX 615 goes high when gP 630 goes low to regulate itself. With the overdrive extender turned off, the output voltage VLX does not switch, and VLX 620 remains low when gP 635 goes low. The signals shown in FIG. 6 are gP_n 610 the PMOS turn on command, VLX the switching LX output node, gN 625 the NMOS gate voltage, and gP 635 the gate voltage of the PMOS power switch with the boost circuit off.

Negative charge pump 530, shown in FIG. 5, is used when the power switch (in this case PMOS) is kept on for several microseconds, to avoid gate voltage gP drifting from the target overdrive trough leakage. The $I_{CP}$ current needed to be sunk is a few microamperes worst case, hence capacitor $C_F$ can be a few hundred femtofarads, if $C_F$ is switched in the MHz region ($I_{CP}=fcp\ C_F*Vbat$). The switching frequency for the negative charge pump, fcp, can be defined locally by a ring oscillator, since it does not need extreme accuracy. There is a need for $I_{CPmin}=fcpmin*C_{Fmax}*Vbatmin$, where $C_F$ needs to be designed to ensure enough leakage compensation in worst case. If not in worst case, the gP will be clamped to −Vdn, where the diode conducts the extra microamperes the charge pump may take in excess. Since $C_F$ is very small, the charge pump switches can also be made very small (~1200 um² of area, including the control logic and ring oscillator).

The negative charge pump is only turned on when gP is low, i.e after the $S_{BN}$ turns on to extend the PMOS overdrive (pulling gP below Vss). The charge pump is turned off as soon as the PMOS is driven to be turned off, i.e. $S_P$ closes to pull gP to Vbat. During the off state, the charge pump has S1 and S3 closed (On), and S4 and S2 open (Off). The cycle is (as an example, variations are possible):

| Switch status vs increasing time | S1 | S2 | S3 | S4 |
|---|---|---|---|---|
| T0 (off, $C_F$ pre-charged) | On | Off | On | Off |
| T1 (T1 > T0) | Off | Off | Off | Off |
| T2 (T2 > T1) ($C_F$ connects to gP) | Off | Off | Off | On |
| T3 (T3 > T2) (Icp is drawn into $C_F$) | Off | On | Off | On |
| T4 (T4 > T3) | Off | Off | Off | Off |
| T5 = T0 (T5 > T4) (off, $C_F$ pre-charged) | On | Off | On | Off |

The present disclosure does not introduce any disadvantage in terms of power conversion efficiency or dynamic behavior degradation at higher Vbat. In fact if a simple Vbat threshold can be designed, the power stage overdrive extender can be enabled/disabled on the fly. The overdrive circuit allows for the power switches to operate beyond the Vbat swing limitation, with low area overhead relative to existing market solutions, and without architectural or technology change. Robust operation is maintained at high switching frequencies and extended power switch On times.

Figure 7:
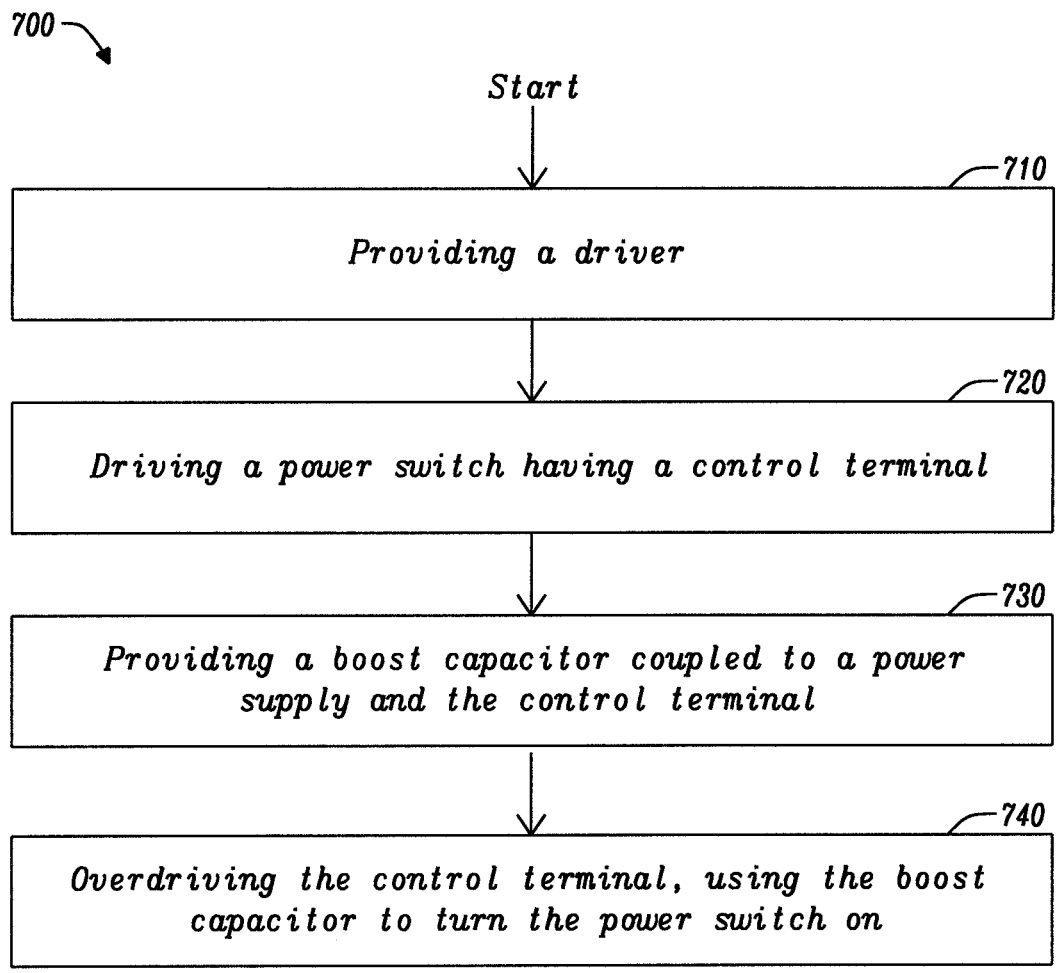
FIG. 7 is a flow chart of a method for overdriving a circuit element.

FIG. 7 is flow chart 700 of a method for overdriving a circuit element. The steps include 710, providing a driver. The steps also include 720, driving a power switch having a control terminal. The steps also include 730, providing a boost capacitor coupled to a power supply and said control terminal. The steps also include 740, overdriving the control terminal, using said boost capacitor, to turn the power switch on.

The main advantage of one or more embodiments of the present disclosure include achieving power stage operation down to Vbatmin levels where operation would not be normally possible due to device technology limitations, such as saturation of the power switches caused by low overdrive vs high inductor current. The disclosure achieves the described performance with low area overhead and requires an equivalent bootstrap capacitor approximately 10× smaller than that of conventional high side NMOS bootstrapping. The present disclosure can be fitted into existing power stage designs with high side PMOS and low side NMOS and low redesign effort. The function can be enabled/disabled on the fly to optimize efficiency and reduce the headroom boosting at higher Vbat voltages. The disclosure can be applied to PMOS and/or NMOS designs, i.e. it can be fitted to any power switch independently, as required by the switch overdrive limitations.

While particular embodiments of the present disclosure have been illustrated and described, it will be understood by those skilled in the art that various changes in form and details may be made without departing from the spirit and scope of the invention.

The invention claimed is:

1. A power stage overdrive circuit, comprising:
   a gate driver output stage, configured to drive a power switch at a control terminal;
   a boost circuit,
      comprising a boost capacitor having a first terminal coupled to a power supply, and a second terminal coupled to the control terminal,
      configured to provide an overdrive voltage to the control terminal to turn the power switch on; and
   a charge pump coupled to the control terminal, the charge pump configured to operate to maintain the power switch below saturation level.

2. The power stage overdrive circuit of claim 1, further comprising a plurality of switches coupled to the boost capacitor, the plurality of switches configured to operate between a first phase and a second phase to adjust a control terminal voltage, wherein in the first phase an amplitude of the control terminal voltage is configured to increase towards a first value, and in the second phase the amplitude of the control terminal voltage is configured to increase further to reach the overdrive voltage.

3. The power stage overdrive circuit of claim 1, wherein the charge pump comprises a negative charge pump.

4. The power stage overdrive circuit of claim 1, wherein the power switch comprises a MOS transistor, and wherein the boost capacitor is about 1/10th of a total gate capacitance of the MOS transistor.

5. The power stage overdrive circuit of claim 1, wherein the power switch comprises a high side PMOS transistor, and wherein the overdrive voltage is a negative voltage.

6. The power stage overdrive circuit of claim 1, wherein the power switch comprises a low side NMOS transistor, and wherein the overdrive voltage is a positive voltage.

7. The power stage overdrive circuit of claim 2, wherein the plurality of switches coupled to the boost capacitor is configured for a one-cycle overdrive boost, for a low supply voltage and high-frequency operation.

8. The power stage overdrive circuit of claim 1, wherein the charge pump coupled to the control terminal is configured for several microseconds of overdrive regulation.

9. The power stage overdrive circuit of claim 1, wherein the power switch is configured for a boosted gate drive voltage in a switching converter.

10. The power stage overdrive circuit of claim 1, wherein the power switch is configured for a signal conditioning circuit.

11. The power stage overdrive circuit of claim 10, wherein the signal conditioning circuit is a switched-capacitor sampling circuit or chopper.

12. A method for overdriving a circuit element, comprising the steps of:
   providing a gate driver output stage;
   driving a power switch at a control terminal;
   providing a boost capacitor coupled to a power supply and said control terminal;
   overdriving the control terminal, using said boost capacitor, to turn the power switch on; and
   operating a charge pump to maintain the power switch below saturation level.

13. The method of claim 12, further comprising a plurality of switches operating between a first phase and a second phase to adjust a control terminal voltage, wherein in the first phase an amplitude of the control terminal voltage increases towards a first value, and in the second phase the amplitude of the control terminal voltage increases further to reach an overdrive voltage.

14. The method of claim 13, wherein the plurality of switches coupled to the boost capacitor operates for a one-cycle overdrive boost, for a low supply voltage and high-frequency operation.

15. The method of claim 12, wherein the charge pump coupled to the control terminal operates for several microseconds of overdrive regulation.

\* \* \* \* \*